June 29, 1954 L. J. PATLA 2,682,645

VARIABLE INDUCTANCE WITH MULTIPLE CONTACT SWITCH

Filed Jan. 18, 1950 3 Sheets-Sheet 1

INVENTOR.
Louis J. Patla.
BY.
Thiess, Olson & Mecklenburger.
Attys.

INVENTOR.
Louis J. Patla.
BY.
Thiess, Olson & Mecklenburger.
Attys.

June 29, 1954 L. J. PATLA 2,682,645

VARIABLE INDUCTANCE WITH MULTIPLE CONTACT SWITCH

Filed Jan. 18, 1950 3 Sheets-Sheet 3

INVENTOR.

Louis J. Patla.

BY

Thiess, Olson & Mecklenburger.

Attys.

Patented June 29, 1954 2,682,645

UNITED STATES PATENT OFFICE 2,682,645

VARIABLE INDUCTANCE WITH MULTIPLE CONTACT SWITCH

Louis J. Patla, Elmwood Park, Ill.

Application January 18, 1950, Serial No. 139,229

5 Claims. (Cl. 336—142)

This invention relates to a multiple contact switch, and more particularly, to a channel selector or band switch for a television receiver or other very high frequency electronic equipment.

A switch constructed in accordance with the present invention has certain advantages which make it particularly adaptable to a band switch for a television receiver or other high frequency electronic apparatus, and, accordingly, the embodiment of the invention shown in the drawings and described below is a switch particularly designed as a band switch for a television receiver. However, it will readily be observed that the advantages of the switch described may be realized in many other applications and embodiments.

In television communication apparatus, and in other electronic apparatus operating with signals having a frequency of 100 to 1,000 megacycles and above, the inductance coils which are used for tuning various circuits to such high frequency signals necessarily have a very small number of turns. In some instances a tuning coil may have as little as one turn, and in extreme cases a short length of straight wire may have the desired amount of inductance.

At the present time frequencies of the order of 900 megacycles are being considered for television broadcasts and when color television is brought into common use, still higher frequencies will presumably be authorized. Where these very high frequencies are used, it is imperative that the leads from the tuning coils to the device intended to utilize the signal, for example an electron tube, be as short as possible in order to avoid the additional inductance which might result from a lead of any substantial length. This problem is complicated in selectable frequency circuits, for example television receivers, by the fact that the inductance coils must be selectable in order to tune the circuit to the various frequency bands.

One conventional practice in tuning circuits to a given frequency is to provide a plurality of stationary inductance coils which are selectable through the use of a rotary switch. Such an arrangement necessitates leads from the coil ends to stationary switch contacts, one or more switch arms for carrying the signal from a selected stationary contact to the axis of rotation of the switch arms, and other leads extending from such axis to the device which is to utilize the signal. This arrangement is reasonably satisfactory where low frequencies, and hence relatively large inductances, are used, but is quite unsatisfactory for such high frequency apparatus as television receivers. Where the frequency is of such a high value as to necessitate the use of a single turn coil, the several leads mentioned above might well have more inductance than the coil itself.

One known expedient for shortening the long leads necessitated by such an arrangement as that described immediately above is the use of a switch in which the coils are mounted in a rotatable drum adjacent the cylindrical surface thereof with the axes of the coils extending parallel to the axis of the drum. A plurality of coils or a multiple tap coil are conventionally wound around a relatively long and thin spool of insulating material, each of the multiple coils or tapped portions of a single coil which are wound on one spool being intended for simultaneous usage when the switch is rotated to one specific position. Contacts arranged in axial lines on the outer cylindrical surface of the drum are connected to the ends of the coils, or coil sections, and selectively engage stationary spring contacts as the drum is rotated.

Such a device, however, has certain inherent disadvantages. Among these is the fact that this arrangement does not permit as short a lead between the coils and the stationary portion of the circuit as is made possible through the use of a switch constructed in accordance with the invention. Another is that the central portion of the drum is wasted space with the result that the switch occupies a much greater space than would otherwise be required. Still another disadvantage is the very considerable force required to move the switch from one position to another.

In accordance with one embodiment of the present invention, the movable contacts are arranged in radially extending rows on one circular plane surface of a cylindrical or disc-like rotary member and the contacts are of the knife-switch type rather than the conventional spring type. The rotary member is shaped substantially like a disc or a wheel since the conventionally thin and elongated coil spools are arranged on the rotary member with their axes extending radially outward from the axis of rotation.

The location of the movable contacts on the end or plane surface of the rotary member and the corresponding convenient arrangement of one or more rows of stationary contacts permits the use of relatively short leads between the stationary contacts and the devices which are to receive the signal coming from the coils. The use of knife switch contacts rather than conventional spring contacts allows a much closer spacing of adjacent contacts, as will subsequently be fully explained, and, accordingly, permits a still further shortening of the leads.

The arrangement of the movable contacts and the coils in radially extending lines utilizes the space within the rotary member of the switch very efficiently, and, accordingly, materially reduces the size of the switch, this being of significant advantage since the conventional band switch for television receivers is quite large and must become progressively larger as more frequency bands are made available for the transmission of television signals, for example for the transmission of color television.

The use of knife switch contacts as opposed to the conventional spring contacts not only permits closer spacing of adjacent contacts but results in a very substantial reduction in the torque required to rotate the switch.

Accordingly, it is an object of the invention to provide an improved multiple contact switch permitting relatively close spacing of adjacent contacts.

Another object of the invention is to provide an improved band switch permitting the use of relatively short leads between the tuning coils and the circuit portions intended to be connected thereto.

It is another object of the invention to provide an improved band switch of reduced dimensions.

It is another object of the invention to provide an improved band switch having a reduced operating torque.

It is another object of the invention to provide an improved band switch having the advantages referred to above while being simple, durable, and economical to manufacture.

The invention, together with further objects and advantages thereof, will best be understood by reference to the following description taken in connection with the accompanying drawings, and its scope will be pointed out in the appended claims.

In the drawings, in which like parts are indicated by like reference numerals:

Figure 1:
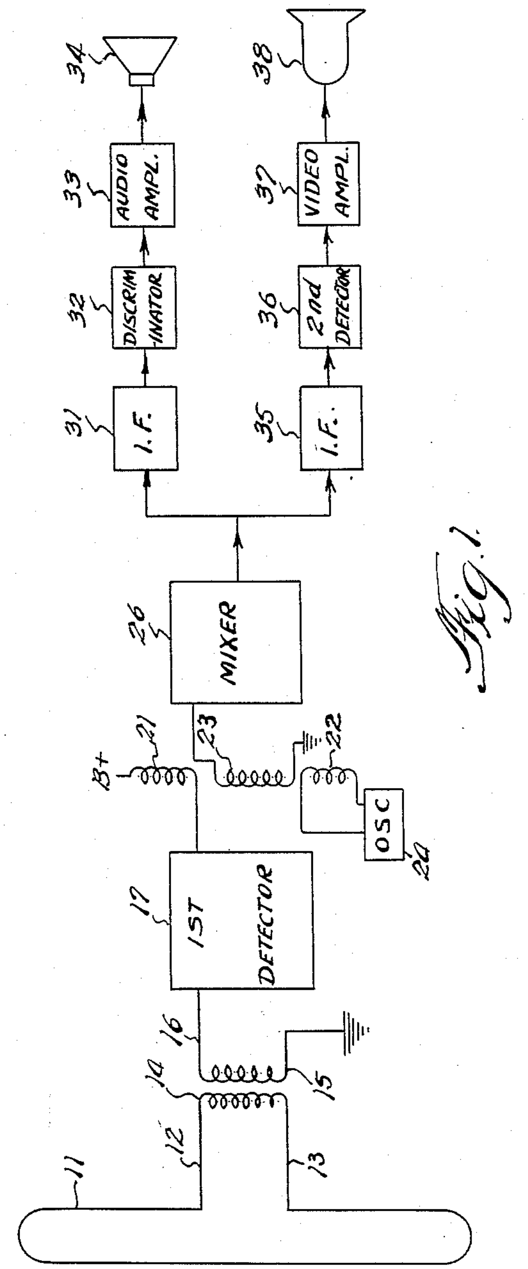
Fig. 1 is primarily a block diagram showing a typical television receiver circuit in which a switch in accordance with the invention may be employed as a band switch.
Figure 2:
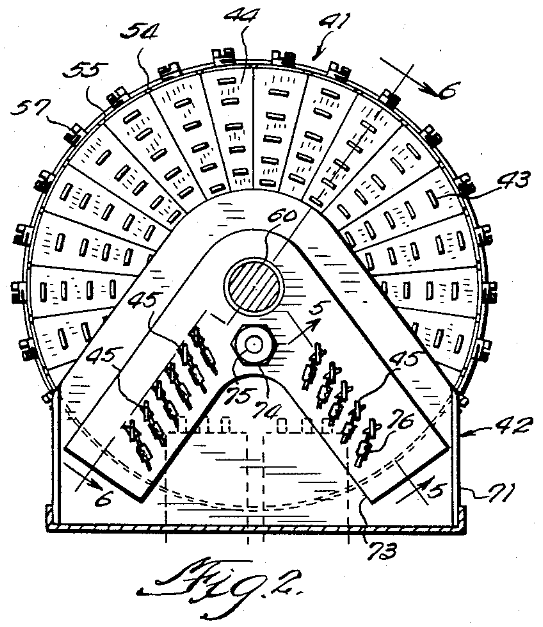
Fig. 2 is a front elevational view of a switch constructed in accordance with one embodiment of the invention.
Figure 3:
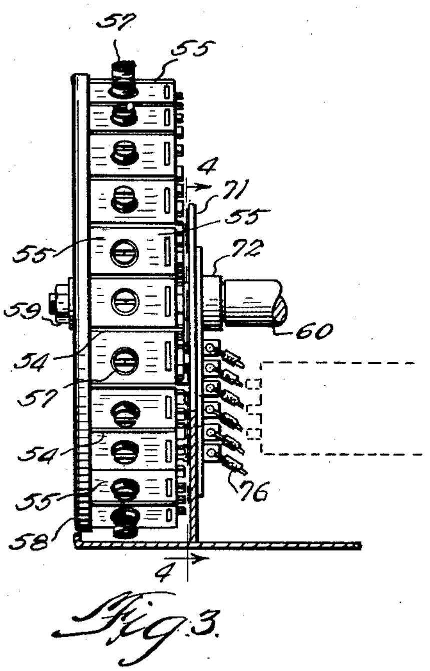
Fig. 3 is a side elevational view of the same switch.
Figure 4:
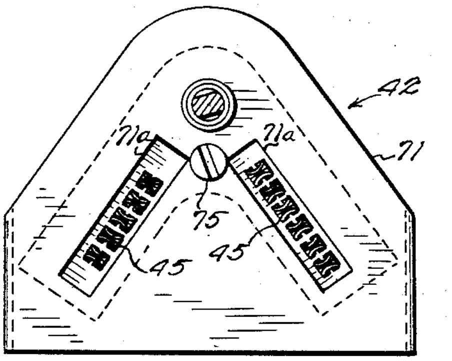
Fig. 4 is a cross-sectional view of the same switch taken along the line 4—4 of Fig. 3.

The television receiver circuit shown in Fig. 1 includes an antenna 11 having two leads 12 and 13 connected to an air core coil 14. This coil is coupled with an adjacent coil 15, the latter coil having one end connected to ground and another end connected through a conductor 16 to a radio frequency amplifier circuit 17.

It is desirable that the antenna circuit, extending from the antenna 11 through the coil 15, be tuned to the frequency of the television channel to be received. Since this antenna circuit is intended to receive both video and audio signals, each of which is of variable frequency, the circuit is tuned to the center frequency of these signals and is tuned broadly in order that it may pass both the video and audio signals of a single band.

Television receivers ordinarily contain a plurality of coils 14 and a plurality of coils 15 which may be selected to vary the resonant frequency of the antenna circuit and thereby to select a given band or range of received signals. It is with the selection of these coils, and other coils subsequently to be described, that the illustrated embodiment of the invention is concerned.

The output circuit of the radio frequency amplifier 17 includes a coil 21 which is coupled with a coil 23 arranged in the input circuit of a mixer stage 26. Another coil 22, in the output circuit of an oscillator 24, is also coupled with the coil 23, whereby the outputs of both the amplifier 17 and the oscillator 24 are coupled to the mixer through the coils 21, 22, and 23.

It is desirable that the radio frequency amplifier output circuit, the oscillator circuit, and the mixer input circuit be tuned to the band of signals being received, and, accordingly, it is conventional practice to make the coils 21, 22, and 23 of selectable inductance value by providing a plurality of coils for each circuit and a selector switch or band switch. It is conventional practice to combine this switch with the band switch which selects the coils 14 and 15 in the antenna circuit. The embodiment of the invention subsequently to be described in detail, is a band switch for selecting the coils 14, 15, 21, 22, and 23 in accordance with the range of signals to be received.

The remainder of the television receiver circuit is of incidental interest only and accordingly will be described only briefly. The signal, after leaving the mixer 26, may be divided to feed the audio circuit and the video circuit separately. The audio circuit, as shown in Fig. 1, includes an intermediate frequency stage 31, a discriminator 32, an amplifier 33, and a speaker 34, and the video circuit includes an intermediate frequency stage 35, a second detector stage 36, an amplifying stage 37, and a viewing tube 38.

The embodiment of the invention, shown in Figs. 2–9, is a multiple contact switch suitable for use in the circuit shown in Fig. 1, and more specifically, for switching coils of various inductance values into the positions in the circuit occupied by the coils 14, 15, 21, 22, and 23. The switch includes a rotary member 41 and a stationary member 42. The rotary member 41 is essentially cylindrical or disc-shaped and has a plurality of movable knife switch contacts 43 positioned on one circular plane surface thereof. These contacts are arranged in radially extending rows on removable pie-shaped segments 44.

Stationary knife switch contacts 45 are arranged on the stationary member 42 in radially extending rows and are so positioned as to cooperate selectively with individual rows of movable contacts 43, depending upon the angular position of the rotary member 41.

In the particular embodiment of the invention disclosed, both the movable and the stationary contacts are arranged in radially spaced and radially aligned formation. While it is desirable that the contacts be radially spaced, for reasons which will subsequently become apparent, it is not essential that the contacts be radially aligned. It is to be understood that where the expression "radially spaced relationship" is employed herein, it is not to be construed as specifying radial alignment. More specifically, any two contacts may be in radially spaced relationship and at the same time may be in circumferentially spaced relationship.

Figure 5:
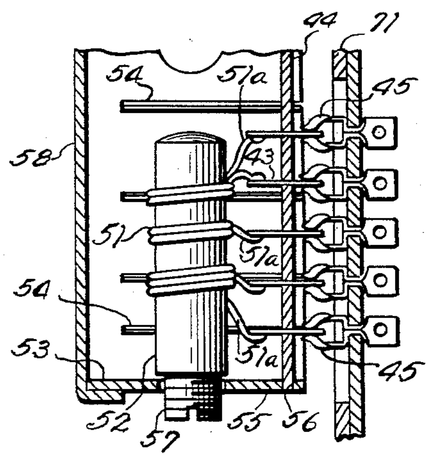
Fig. 5 is a partial, cross-sectional view of the same switch taken along the line 5—5 of Fig. 2.
Figures 6, 7:
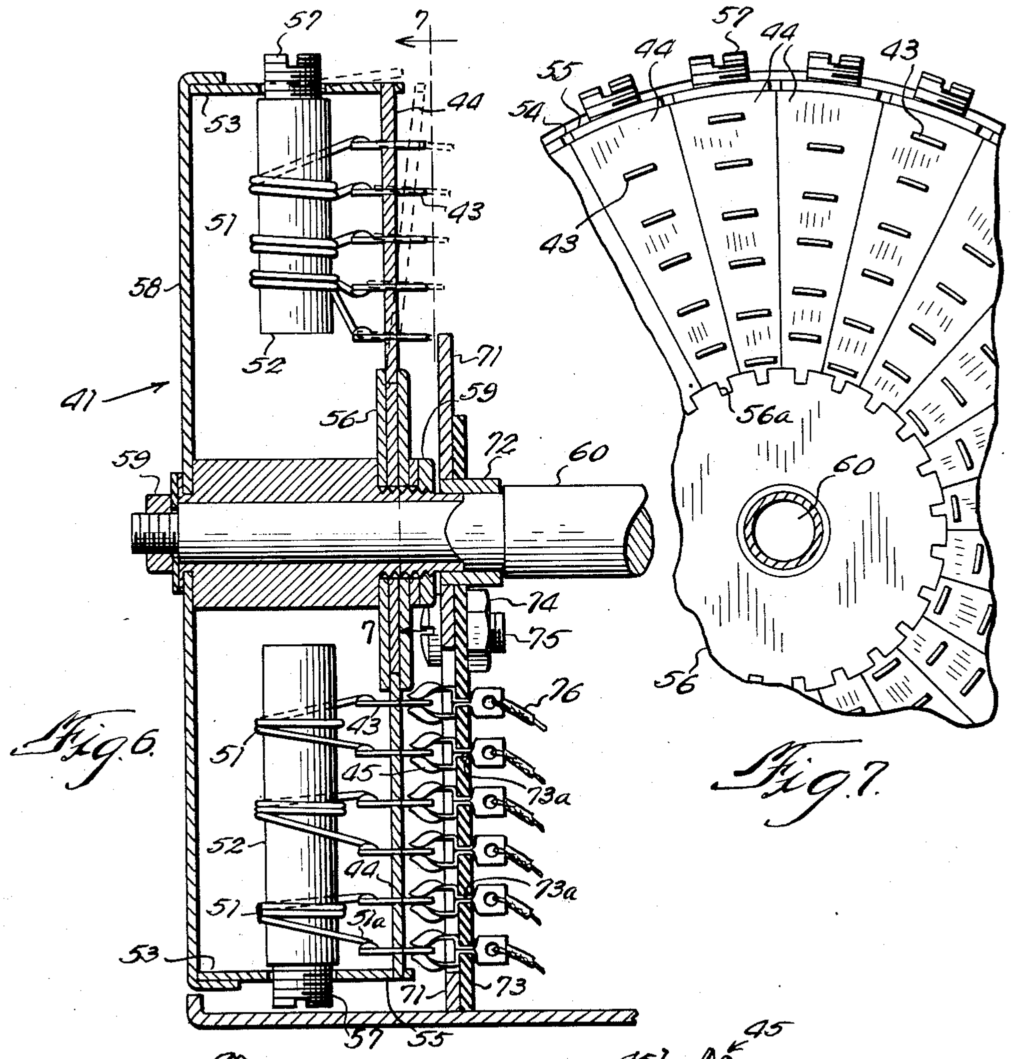
Fig. 6 is an enlarged cross-sectional view of the same switch taken along the line 6—6 of Fig. 2.
Fig. 7 is a partial view of the same switch, partly in cross section, taken along the line 7—7 of Fig. 6.
Figure 8:
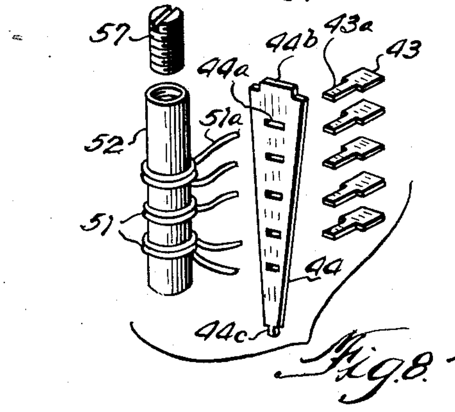
Fig. 8 is a perspective, exploded view of one segment of the rotary portion of the same switch.

Mounted on the other face of the pie-shaped segments 44, as may best be seen in Figs. 5, 6 and 8, are a series of air core coils 51. It will be noted in Fig. 8 that the movable contacts 43 have reduced portions 43a which pass through slots 44a in the pie-shaped segments 44. These reduced portions fit snugly in the slots and the contacts are supported thereby. The ends of the reduced portions 43a extend beyond the rear surfaces of the pie-shaped segments 44 and the end leads or the tapped connections 51a of the coils 51 are secured thereto, for example by soldering, all as clearly seen in Figs. 5 and 6. The coils 51 are wound on an insulating spool 52 and the coil and spool assemblies are supported on the contacts 43 by the leads 51a.

In the particular embodiment illustrated in the drawings, two rows of stationary contacts 45 are employed. The contacts in each of these rows are uniformly radially spaced but the contacts of one row are radially staggered with respect to the other row, to the effect that an individual movable contact 43 which may cooperate with a stationary contact 45 in one row will pass between the stationary contacts in the other row. Similarly, the movable contacts 43 are uniformly radially spaced but the movable contacts of any one row are radially staggered with respect to the contacts in other rows, preferably the adjacent rows. Accordingly, the movable contacts 43 of any one radially extending row may cooperate with only one of the two rows of stationary contacts while adjacent rows of movable contacts may cooperate with only the other row of stationary contacts.

The adjacent rows of movable contacts 43 are uniformly angularly spaced and the angle between the two rows of stationary contacts is an odd integral multiple of the angle between adjacent rows of movable contacts. As a result, when one row of movable contacts is in cooperation with one row of stationary contacts, another row of movable contacts, spaced from the first-named row of movable contacts by an odd number of segments, will be in contact with the other row of stationary contacts. This arrangement permits two rows of movable contacts to be connected into the television receiver circuit at one time. The purpose of this is, of course, to permit simultaneous use of the coils mounted on two different segments 44. The coils connected to one row of stationary contacts might, for example, be used for tuning the antenna circuit while the coils simultaneously connected to the other row of stationary contacts are used for tuning the first detector output circuit, the oscillator circuit and the mixer input circuit.

The pie-shaped segments 44 are made readily removable in the interest of convenient disassembly and reassembly in the event that repairs are needed. To this end the cylindrical surface of the drum-shaped rotating member 41 consists primarily of a resilient sheet of metal 53 having a series of axially extending slots 54 therein, whereby the right-hand end of this sheet, as viewed in Figs. 3, 5, and 6, takes the form of a series of resilient leaves 55. Near the right-hand end of each leaf 55 there is a circumferentially extending slot 56, so shaped as to snugly receive a radially protruding tip 44b of a pie-shaped segment 44. The other ends of the segments 44 are held in place by a hub member 56 which has a series of shallow, radially extending notches 56a therein for receiving radially extending tips 44c at the inner or pointed ends of the pie-shaped segments 44.

The ends of the leaves 55 may be forced radially outwardly, for example by manual manipulation, to disengage any one or more leaves from the outer tips 44b of a corresponding segment or segments. The segment may then be pivoted outwardly, as indicated by the dotted lines in Fig. 6, after which the segment along with the corresponding contacts and coils may be withdrawn from the hub member 56 and entirely removed from the rotary switch member 41.

The inner surface of the outer end of each spool 52 is adapted to receive a threaded plug 57 which is of brass or copper or other dimagnetic material. These plugs 57 are employed to vary the inductance of the individual coils 51 by screwing the plug toward or away from the coil. Before a segment 44 and the corresponding coil and spool assembly can be removed from the drum-shaped rotary member 41 in the specific embodiment illustrated, the corresponding plug 57 must be removed from the spool or screwed into the spool far enough to clear the corresponding leaf 55, as will be evident upon examination of Fig. 6.

The rear circular plane surface of the drum member 44 consists of a disc 58 which is bent over at its periphery for convenient securing thereto of the cylindrical sheet 53 by any suitable means. The center of the disc 58 and a hub member 56 are secured by nuts 59 to a spindle 60 which has a suitable handle, not shown in the drawings, for convenient turning of the entire rotary member 41.

A detent mechanism is preferably employed for resiliently maintaining the rotary member 41 in the various positions in which the movable and stationary contacts cooperate. Since this device may be of any suitable form, of which many are conventionally used, it has been omitted from the drawings in the interest of a clearer showing of the inventive portion of the switch.

The stationary member 42 includes a rigid sheet member 71 which serves as a base for the stationary contacts 45 and which has a bearing surface 72 in which the spindle 60 may rotate. The sheet 71 may be of plastic or other insulating material or it may be of metal, as in the illustrated embodiment, in which case a slot 71a is provided in the region of each row of stationary contacts 45. A plastic or other insulating sheet 73 is arranged to overlie the slots 71a and to support the stationary contacts, the insulating sheet 73 being secured to the base member 71 by any suitable means, such as the nut and screw 74 and 75, respectively. It will be apparent that the purpose of the insulating sheet 73 is to insulate the stationary contacts 45 from the metal base 71.

Figure 9:
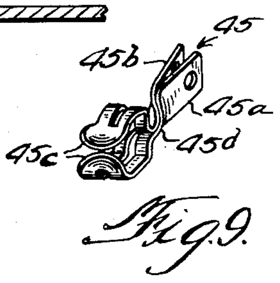
Fig. 9 is a perspective view of one of the stationary contacts.

According to the preferred embodiment illustrated in Fig. 9, the stationary contacts 45 are shown as made up of two separate stamped sheets 45a and 45b. These contact elements are so shaped as to provide spring jaws 45c for receiving the movable contacts 43. The middle portions of the contact elements are brought together at the point 45d for passing through slots 73a in the insulating sheet 73 while the right-hand ends of these elements, as viewed in Fig. 9, are twisted approximately 90 degrees to secure the contacts firmly to the insulating sheet 73. The right-hand ends of the contacts are, of course, intended to be connected to leads 76 appearing in Figs. 3 and 6.

It will be very evident that the relative positions of the stationary contacts 45, resulting from the switch construction described above, enable these contacts to be connected to tubes or other portions of a television receiver circuit by very short leads. To illustrate this advantage more clearly, a pair of tubes are outlined in phantom lines in Fig. 2. It will be seen that the distance from the various stationary contacts 45 to the prongs of the tubes is extremely short. Another possible position for the tubes is shown by the phantom lines in Fig. 3, again illustrating the close possible spatial relation of the tube prongs and the stationary contacts 45.

As explained above, this feature of the invention is one sorely needed in high frequency electronic apparatus such as television receivers where very small inductances of selectable value are needed, and is of substantial importance in any similar circuit wherein it is desired to reduce the length of leads whether it be for the purpose of minimizing extraneous inductance or for minimizing the effect of extraneous signals, or other purposes.

This advantageous spacing of the stationary contacts is made possible, jointly and separately, by several construction features of the switch. One of these is the mounting of the coils 51 on the rotary member of the switch where the coil leads may be connected directly to the movable contacts by very short leads. A second feature of the construction is the location of the movable contacts on the end surface or circular plane surface of the drum rather than on the cylindrical surface thereof. It will be readily apparent that this construction feature permits the two rows of stationary contacts to be given various angular relationships desired in the interest of shortening the leads from the stationary contacts to the tube prongs. Another construction feature aiding materially in the shortening of the leads is the use of knife switch contacts, particularly when located as shown on one end or plane surface of the rotary member. As will be apparent upon examination of Figs. 5 and 6, the use of this form of contact permits very close spacing of adjacent stationary contacts with the novel result that the leads from the stationary contacts to a substantially centrally located device, such as the tubes shown in phantom in Figs. 2 and 3, may be extremely short.

Thus it is seen that these three construction features of the switch shown in the drawings and described above, individually and jointly, contribute very materially to the shortening of the leads from the inductance coils to the tubes or other circuit portions.

Other advantages arise from these construction features in addition to the shortening of the leads. The location of the movable contacts in radial lines or rows on the circular plane surface of the rotatable switch member permits the positioning of the coils such that their axes extend radially of the spindle 59 while permitting the use of short leads from the coils to the movable contacts. This arrangement of the coils utilizes the available space very efficiently, whereby a switch with a given number of coils and contacts may occupy a minimum of space. In the case of a band switch for a television set, this is of material advantage since the switch is normally of substantial size. This will be progressively of greater importance as additional transmission bands are made available as this will necessitate a larger number of coils and contacts in order to permit the receiver to pick up all bands. Ultimately, a band switch may be required which employs two or three switches such as that shown in the drawings. With the previously known types of band switches, having the contacts on the cylindrical surface of the drum, a multiple switch for tuning a television set to the additional bands would take on objectionally large proportions, while a switch such as that shown in the drawings will remain of modest proportions even though two or three sections are required.

The use of knife switch contacts as opposed to conventional spring contacts has substantial advantages in addition to the closer possible spacing of the contacts. The use of a substantial number of simultaneously cooperating contacts, as is necessary in a band switch for electronic circuits, produces a very substantial resistance to rotation of the switch where conventional spring contacts are employed. This arises from the fact that the spring contact must rise up over the rigid contact, this displacement of the spring contact requiring substantial force and energy. When this force is multiplied by 10, for example, it becomes very objectionable. In addition to this, a stiffly operating detent mechanism must be employed to maintain the spring contacts at the center of the rigid contacts since the spring contacts tend to slide off the rigid contacts. With such an arrangement, the force required to operate the switch reaches such proportions as to be very objectionable.

Where knife switch contacts are used, the female member may be pretensioned and the male member may be made very thin with the result that a substantial contact pressure is obtained in spite of the fact that engagement of the contacts causes very slight displacement of the female member. Furthermore, since the male member may be relatively long and thin, there is no tendency for the contact element to disengage, and, accordingly, a detent mechanism of relatively light force may be employed. These characteristics of the knife switch combine to permit rotation of the switch with a relatively small torque in spite of the use of multiple contacts.

While a particular embodiment of the invention has been shown, it will be understood, of course, that the invention is not limited thereto since many modifications may be made, and it is, therefore, contemplated to cover by the appended claims any such modifications as fall within the true spirit and scope of the invention.

The invention having thus been described, what is claimed and desired to be secured by Letters Patent is:

1. A multiple contact switch comprising a member rotatable about a fixed axis, a plurality of movable knife switch contacts mounted on said rotatable member in lines extending radially of said axis from a common point thereon, and a plurality of stationary knife switch contacts for selectively cooperating with said movable contacts, said stationary contacts being arranged in two rows extending radially of said fixed axis, the movable contacts in some of said lines being radially staggered with respect to the movable contacts in others of said lines and the stationary contacts in one of said rows being radially staggered with respect to the stationary contacts in the other of said rows, whereby some of said lines of movable contacts can cooperate with only one of said rows of stationary contacts and others of said lines of movable contacts can cooperate with only the other of said rows of stationary contacts.

2. A band switch for a television receiver, said switch comprising a member rotatable about a fixed axis, a plurality of movable knife switch contacts mounted on said rotatable member in lines extending substantially radially of said axis from a common point thereon, a plurality of stationary knife switch contacts selectively cooperable with said movable contacts, said stationary contacts being arranged in two rows extending substantially radially of said fixed axis, the movable contacts in some of said lines being radially staggered with respect to the movable contacts in others of said lines and the stationary contacts in one of said rows being radially staggered with respect to the stationary contacts in the other of said rows, whereby some of said lines of movable contacts can cooperate with only one of said rows of stationary contacts and others of said lines of movable contacts can cooperate with only the other of said rows of stationary contacts, and a plurality of inductance coils mounted on said member and connected to said movable contacts, the axes of said coils lying substantially in a single plane and extending substantially radially of said fixed axis of said rotatable member.

3. A band switch for a television receiver, said switch comprising a member rotatable about a fixed axis, a plurality of movable contacts mounted on said rotatable member in lines extending substantially radially of said axis from a common point thereon, a plurality of stationary contacts selectively cooperable with said movable contacts, said stationary contacts being arranged in two rows extending substantially radially of said fixed axis, the movable contacts in some of said lines being radially staggered with respect to the movable contacts in others of said lines and the stationary contacts in one of said rows being radially staggered with respect to the stationary contacts in the other of said rows, whereby some of said lines of movable contacts can cooperate with only one of said rows of stationary contacts and others of said lines of movable contacts can cooperate with only the other of said rows of stationary contacts, and a plurality of inductance coils mounted on said member and connected to said movable contacts, the axes of said coils lying substantially in a single plane and extending substantially radially of said fixed axis of said rotatable member.

4. A multiple contact switch comprising a member rotatable about a fixed axis, a plurality of movable knife switch contacts mounted on said rotatable member in radially spaced relationship, and a plurality of stationary knife switch contacts for selectively cooperating with said movable contacts, said stationary contacts being arranged in two groups in which individual stationary contacts are in radially spaced relationship, the stationary contacts in one of said groups being radially staggered with respect to the stationary contacts in the other of said groups, whereby some of said movable contacts can cooperate with only one of said groups of stationary contacts and others of said movable contacts can cooperate with only the other of said groups of stationary contacts.

5. A multiple contact switch comprising a member rotatable about a fixed axis, a plurality of movable switch contacts mounted on said rotatable member in radially spaced relationship, and a plurality of stationary switch contacts for selectively cooperating with said movable contacts, said stationary contacts being arranged in two groups in which individual stationary contacts are in radially spaced relationship, the stationary contacts in one of said groups being radially staggered with respect to the stationary contacts in the other of said groups, whereby some of said movable contacts can cooperate with only one of said groups of stationary contacts and others of said movable contacts can cooperate with only the other of said groups of stationary contacts.

References Cited in the file of this patent

UNITED STATES PATENTS

| Number | Name | Date |
|---|---|---|
| 1,986,525 | Pfaff et al. | Jan. 1, 1935 |
| 2,078,908 | Harrison | Apr. 27, 1937 |
| 2,496,183 | Thias et al. | Jan. 31, 1950 |
| 2,513,392 | Aust | July 4, 1950 |
| 2,545,681 | Zepp et al. | Mar. 20, 1951 |

FOREIGN PATENTS

| Number | Country | Date |
|---|---|---|
| 615,106 | Great Britain | Jan. 3, 1949 |